US009355692B2

(12) United States Patent
Bunce et al.

(10) Patent No.: US 9,355,692 B2
(45) Date of Patent: May 31, 2016

(54) HIGH FREQUENCY WRITE THROUGH MEMORY DEVICE

(71) Applicant: International Business Machines Corporation, Armonk, NY (US)

(72) Inventors: Paul A. Bunce, Poughkeepsie, NY (US);
Yuen H. Chan, Poughkeepsie, NY (US);
John D. Davis, Wallkill, NY (US);
Diana M. Henderson, Poughkeepsie, NY (US); Jigar J. Vora, Westborough, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 331 days.

(21) Appl. No.: 13/622,189

(22) Filed: Sep. 18, 2012

(65) Prior Publication Data
US 2014/0078835 A1    Mar. 20, 2014

(51) Int. Cl.
*G11C 7/10* (2006.01)
*G11C 7/22* (2006.01)

(52) U.S. Cl.
CPC .............. *G11C 7/106* (2013.01); *G11C 7/1069* (2013.01); *G11C 7/1087* (2013.01); *G11C 7/1096* (2013.01); *G11C 7/22* (2013.01)

(58) Field of Classification Search
CPC ........ G11C 7/106; G11C 7/1069; G11C 7/22; G11C 7/1096; G11C 7/1087
USPC ............... 365/189.14, 189.05, 185.08, 196, 365/233.16, 233.17, 189.15, 189.16; 711/141, 142, 143
See application file for complete search history.

(56) References Cited

U.S. PATENT DOCUMENTS

| 5,357,478 | A | * | 10/1994 | Kikuda et al. | ........... 365/230.03 |
| 7,626,854 | B1 | | 12/2009 | Yang et al. | |
| 2006/0034132 | A1 | | 2/2006 | Jain | |
| 2009/0116298 | A1 | | 5/2009 | Adams et al. | |
| 2011/0149661 | A1 | | 6/2011 | Rajwani et al. | |

FOREIGN PATENT DOCUMENTS

CN    101369452 A    2/2009
KR       328161 B    8/1996

OTHER PUBLICATIONS

Khellah, Muhammad, et al, "Process, Temperature, and Supply-Noise Tolerant 45 nm Dense Cache Arrays with Diffusion-Notch-Free (DNF) 6T SRAM Cells and Dynamic Multi-Vcc Circuits", IEEE Journal of Solid State Circuits, vol. 44, Issue 4; Apr. 2009; pp. 1199-1208.

* cited by examiner

*Primary Examiner* — J. H. Hur
(74) *Attorney, Agent, or Firm* — Cantor Colburn LLP; Margaret McNamara

(57) ABSTRACT

Embodiments include a high frequency write through memory device including a plurality of memory cells and a plurality of local evaluation circuits. Each of the plurality of local evaluation circuits are coupled to at least one of the plurality of memory cells and are configured to prevent data stored in the coupled memory cells from being written to a latch node during a write through operation.

3 Claims, 4 Drawing Sheets

US 9,355,692 B2

HIGH FREQUENCY WRITE THROUGH MEMORY DEVICE

BACKGROUND

The present invention relates generally to high frequency memory, and more specifically, to high frequency write through memory.

In general, a write policy determines how a memory device performs a write operation. One common write policy is a called a write through policy. In a memory device having a write through policy, the processor writes through the memory device to another location, such as the main memory. During the write though, the memory device may update its contents, but the write operation is not complete until the data is passed though the memory device to the other location. Currently available memory devices that have a write-though policies are generally configured to be able to perform both write though data operations and read operations.

High frequency circuit design requires the use of short, or narrow, evaluation pulses as well as short restore pulses. Accordingly, in order to maximize the frequency of a memory device, the variations in the pulse width required for a write though data operation and a read operation should be as small as possible. However in current memory devices, the timing of the signals used for write though operations and read operations are subject to variations based on their propagation through largely different signal paths, which can lead to these signals becoming misaligned. As a result, the pulse widths required to be used for the memory devices must be wide enough to ensure that the proper signal is provided on the output of the memory device.

SUMMARY

Embodiments of the disclosure include a high frequency write through memory device including a plurality of memory cells and a plurality of local evaluation circuits. Each of the plurality of local evaluation circuits are coupled to at least one of the plurality of memory cells and are configured to prevent data stored in the coupled memory cells from being written to a latch node during a write through operation.

Embodiments of the disclosure also include a method for increasing the frequency of a write through memory device having a plurality of memory cells and a plurality of local evaluation circuits, wherein each of the plurality of local evaluation circuits are coupled to at least one of the plurality of memory cells. The method includes receiving an address signal corresponding to the at least one of the plurality of memory cells of the write through memory device and receiving at least one of a read enable signal and a write enable signal. Based on determining that the read enable signal is active, the method includes activating the memory cell and writing a stored data from the memory cell to the latch node. Based on determining that the read enable signal is not active, the method includes preventing, by the coupled local evaluation circuit, the stored data from the memory cell from being written to a latch node. Based on determining that the write enable signal is active, the method includes writing a data received from a data signal to the latch node.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiment are apparent from the following detailed description taken in conjunction with the accompanying drawings in which:

DETAILED DESCRIPTION

In exemplary embodiments, methods and systems are provided for increasing the frequency of a write though memory device. In exemplary embodiments, a write though memory device is configured such that the timing variation of signals used to enable write through operations and read operations are minimized. Accordingly, shorter, or narrow, evaluation pulses as well as restore pulses can be used by the write though memory device and it can be operated at a higher frequency. In exemplary embodiments, the write though memory devices include a plurality of memory cells that each have a local evaluation circuit, which is configured to prevent the memory cell from writing data to the output, or latch node, during write through operations.

Figure 1:
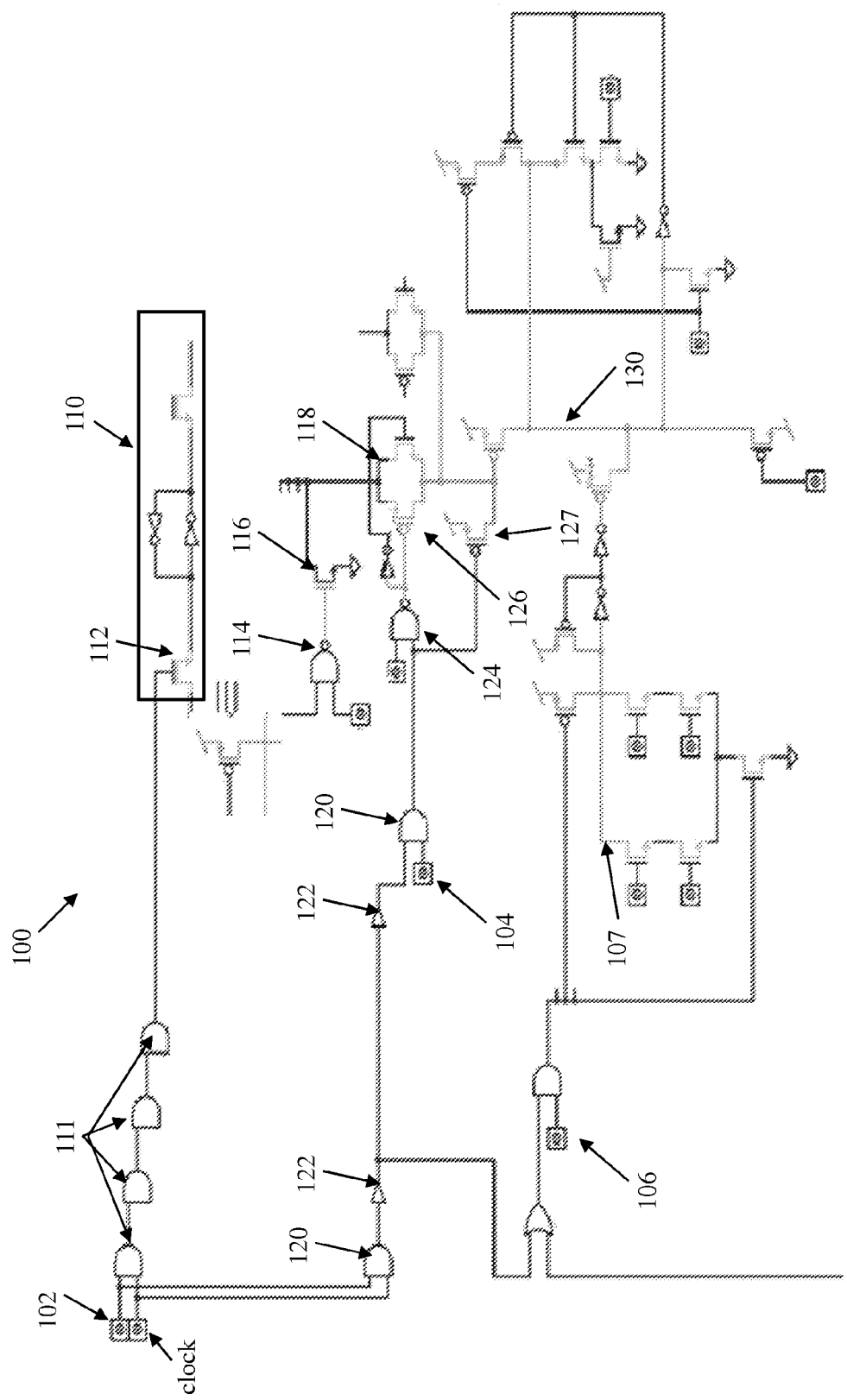
FIG. 1 depicts a schematic diagram of a portion of a traditional write through memory device.

FIG. 1 illustrates a schematic diagram of a portion of a traditional write through memory device 100. The write through memory device 100 receives an address signal 102, a read enable signal 104, a write enable signal 106 and responsively writes either the data stored in a memory cell 110 or a data input signal 107 to a latch node 130. The address signal 102 is utilized to activate an identified memory cell 110 in the memory device 100 and to output the contents of the identified memory cell 110 onto the latch node 130. The memory device 100 is configured to operate in a read mode and a write through mode. During the read mode, the read enable signal 104 is active, or high, the contents of the identified memory cell 110 are output onto the latch node 130. During the write through mode, the read enable signal 104 is inactive, or low, the contents of the identified memory cell 110 are prevented from being output to the latch node 130. During both the read mode and the write through mode, a first signal path, or read data path, is used to activate the identified memory cell 110. The read data path includes a plurality of AND gates 111, NFETs 112, 116, 118, PFET 126, and a NAND gate 114. During the read mode a second signal path, or read enable path, is used to enable the identified memory cell to be written to the latch node 130. During the write through mode, the read enable signal path is used to prevent the data from the identified memory cell 110 from being written to the latch node 130. The read enable path includes a plurality of AND gates 120, a plurality of buffers 122, a NAND gate 124 and a PFET 127. Since the read data and read enable signal paths include many different circuit elements, and potentially a different number of circuit elements, the variation in the timing of these signals across the two paths can be high. As a result, the pulses driving these two paths need to be wide enough to ensure that the pulses overlap where the signals meet. The required width of the pulses limit the frequency at which the memory device 100 can operate. Accordingly, what is needed is a memory device that is configured to have a read enable signal that has a minimal variation from the read data signal.

Figure 2:
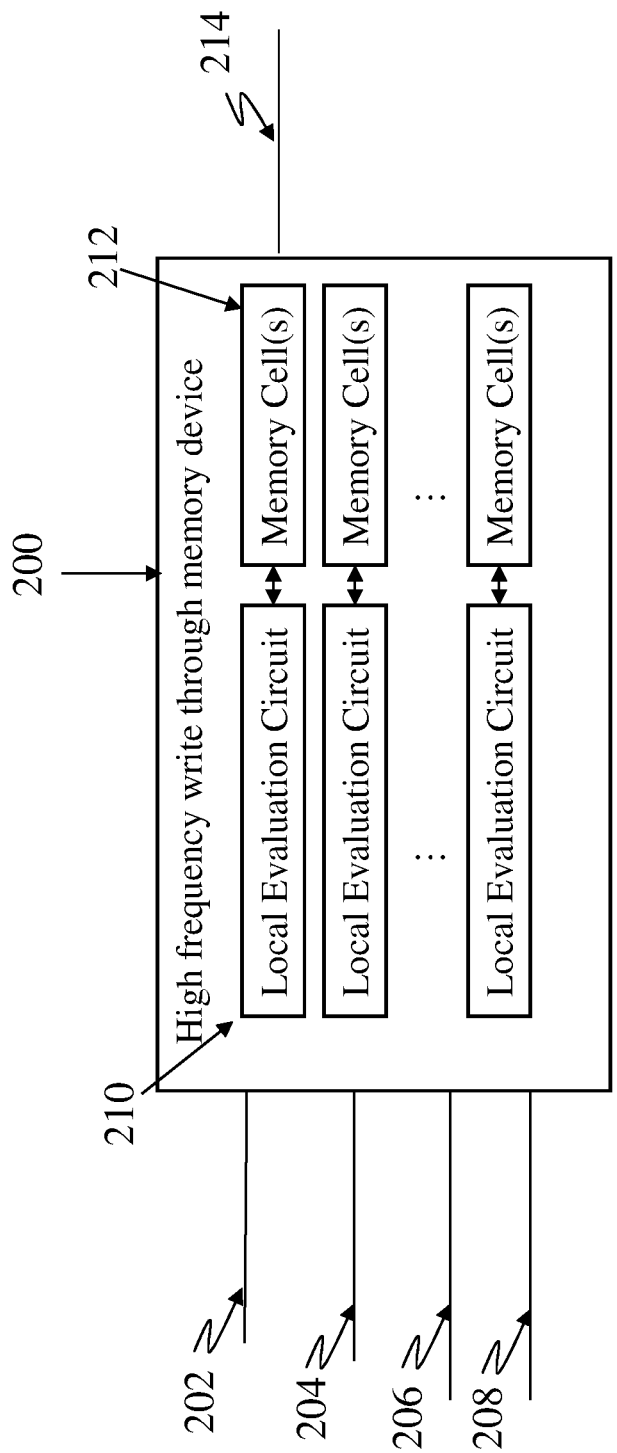
FIG. 2 depicts a block diagram of a high frequency write through memory device in accordance with an exemplary embodiment.

Referring now to FIG. 2, a block diagram of a high frequency write through memory device 200 in accordance with an exemplary embodiment is shown. As illustrated the high frequency write through memory device 200 includes a plurality of memory cells 212 that are each coupled to a local evaluation circuit 210. The high frequency write through memory device 200 receives a plurality of input signals and responsively provides an output signal 214. The input signals can include, but are not limited to, an address signal 202, a read enable signal 204, a write enable signal 206, and a data signal 208.

The high frequency write through memory device 200 is configured to operate in two modes. The first operating mode is a read mode in which the high frequency write through memory device 200 provides an output signal 214 that is data read from one of the memory cells 212 corresponding to the address signal 202. The second operating mode is a write through mode in which the high frequency write through memory device 200 provides an output signal 214 that is the data received from the input data signal 208. In exemplary embodiments, the high frequency write through memory device 200 is configured to utilize the read enable signal 204 and the write enable signal 206 to determine the operating mode of the high frequency write through memory device 200.

In exemplary embodiments, each of the local evaluation circuits 210 are coupled to a memory cell 212 and are configured to prevent the memory cells 212 from writing to the output signal 214 during the write through mode. In exemplary embodiments, by utilizing the local evaluation circuits 210, the high frequency write through memory device 200 is able to maximize a length of a common signal path used by a read enable signal and a read data signal. By maximizing the length of the common signal path, the variation in the timing of the read enable signal and a read data signal is reduced. As a result of the decreased timing variation, the width of the pulses driving these two paths can be reduced while still ensuring that the pulses overlap where the signals meet. Accordingly, the high frequency write through memory device 200 is configured to be able to operate at higher frequencies than traditional write through memory devices.

In exemplary embodiments, the high frequency write through memory device 200 is configured such that the variation in the timing of the output signal 214 in the read mode and the write through mode is minimized. In exemplary embodiments, the memory cells 212 may be individual memory cells or may include multiple memory locations, for example sixteen bits of memory.

Figure 3:
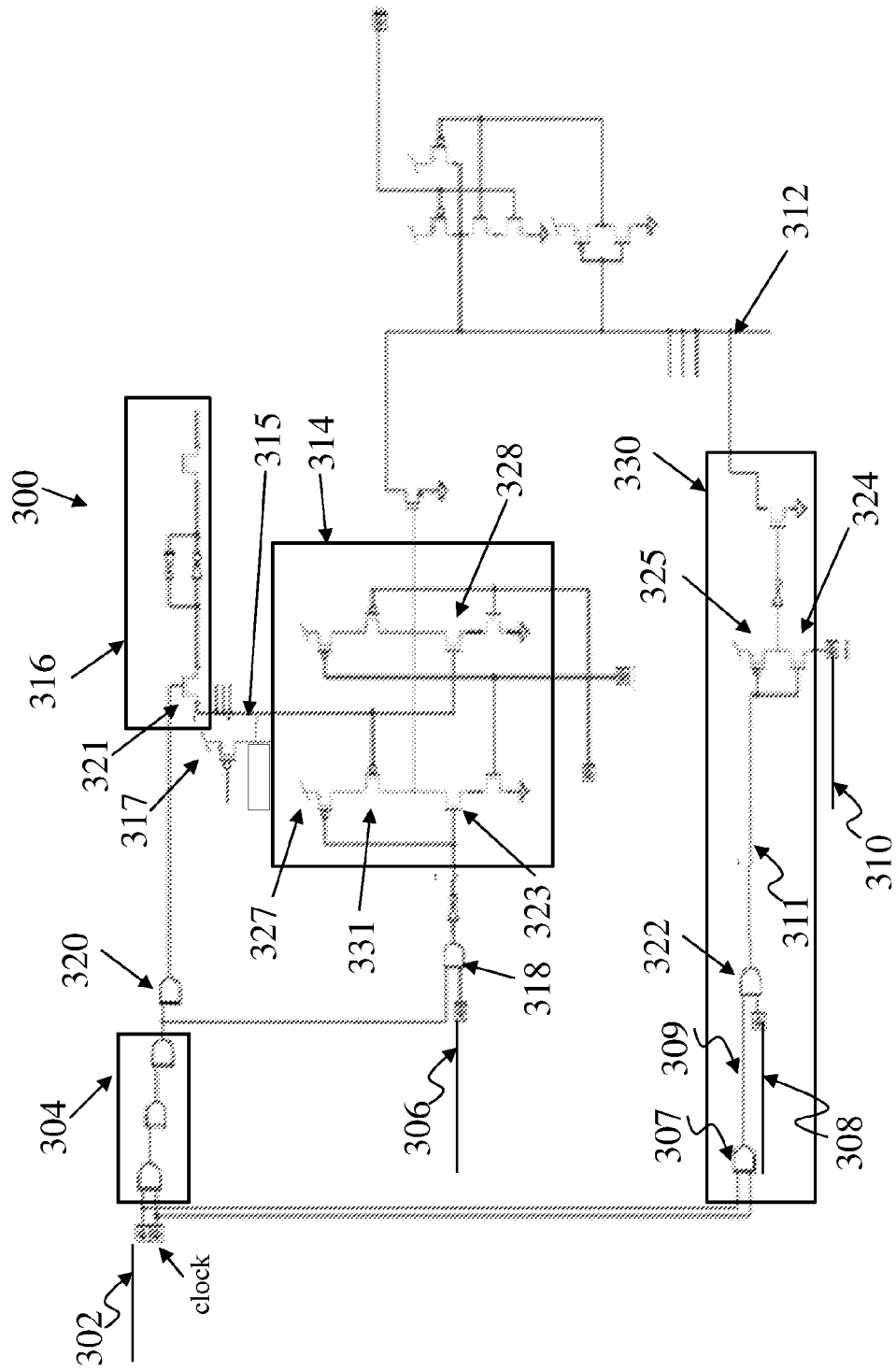
FIG. 3 depicts a schematic diagram of a portion of a high frequency write through memory device in accordance with an exemplary embodiment.

Referring now to FIG. 3, a schematic diagram of a portion of a high frequency write through memory device 300 in accordance with an exemplary embodiment is shown. As illustrated, the high frequency write through memory device 300 includes a memory cell 316 that is coupled to a local evaluation circuit 314. In exemplary embodiments, NFET 321 is used to selectively provide the contents of the memory cell 316 to the local evaluation circuit 314 via a local bit line 315. In exemplary embodiments, the high frequency write through memory device 300 includes a pre-charge transistor 317 on the local bit line 315. It will be understood by those of ordinary skill in the art that the depicted read and write through methods are merely exemplary and that any number of cell writing schemes can also be used. The high frequency write through memory device 300 receives a plurality of input signals and responsively writes an output signal to a latch node 312. The input signals can include, but are not limited to, an address signal 302, a read enable signal 306, a write enable signal 308, and a data signal 310. The high frequency write through memory device 300 includes a write through circuit 330, which is configured to receive the write enable signal 308 and data signal 310 and to write the data signal 310 to the latch node 312 when the write enable signal 308 is active.

In exemplary embodiments, high frequency write through memory device 300 includes a common signal path 304, which receives the address signal 302 and responsively provides an active, or high signal, to AND gate 320 and AND gate 318 that are associated with address of the memory cell 316 provided in the address signal 302. The AND gate 318 receives the read enable signal 306 and the output of the common signal path 304, and if both signals are active, the data stored in the memory cell 316 is written to the latch node 312. However, if either the read enable signal 306 or the signal received from the common signal path 304 are not active, the local evaluation circuit 314 prevents the data of the memory cell 316 from being written to the latch node 312. In exemplary embodiments, the local evaluation circuit 314 includes a plurality of PFETs 327, 331 and NFETS 323, 328 which are configured to receive the output of the AND gate 318 and NFET 321 and to selectively provide the data of the memory cell 316 to the latch node 312. In one embodiment, when the read enable signal 306 is active, the output of the AND gate 318 deactivates the NFET 323 and activates PFET 327, enabling the output of the memory cell 316 to be output onto the latch node 312. Alternatively, when the read enable signal 306 is inactive, the NFET 323 is activated and PFET 327 is not activated and the output of the memory cell 316 is prevented from being output onto the latch node 312.

In exemplary embodiments, the write through circuit 330 includes AND gates 307 and 322, which receives the address signal 302 and the write enable signal 308. The write through circuit 330 also includes a PFET 325 and an NFET 324, the gates of which receives the output of AND gate 322. If both the dynamic address signal 309 and the write enable signal 308 are active, signal 311 activates the NFET 324 and the data signal 310 is written to the latch node 312. However, if either of the dynamic address signal 309 and the write enable signal 308 are not active, signal 311 is not active and the data signal 310 is prevented from being written to the latch node 312 because the NFET 324 is inactive. It will be appreciated by those of ordinary skill in the art that signal 311 may be generated in any number of ways and is configured to be active during a write through operation and in active during a read operation.

In exemplary embodiments, the write through memory device 300 includes a read data signal path which includes the common signal path 304, the AND gate 320, PFET 331 and NFETs 321, 328. The write through memory device 300 also includes a read enable signal path which includes the common signal path 304, the AND gate 318, NFETs 323, and PFETs 327. In exemplary embodiments, by utilizing the local evaluation circuits 314 the high frequency write through memory device 300 is able to maximize a length of the common signal path 304 used by both read data path and read enable paths and reduce the timing variations between the two paths. By maximizing the length of the common signal path, the variation in the timing variation of the read enable signal and a read data signal is reduced. As a result of the decreased timing variation, the width of the pulses driving these two paths can be reduced while still ensuring that the pulses overlap where the signals meet.

Figure 4:
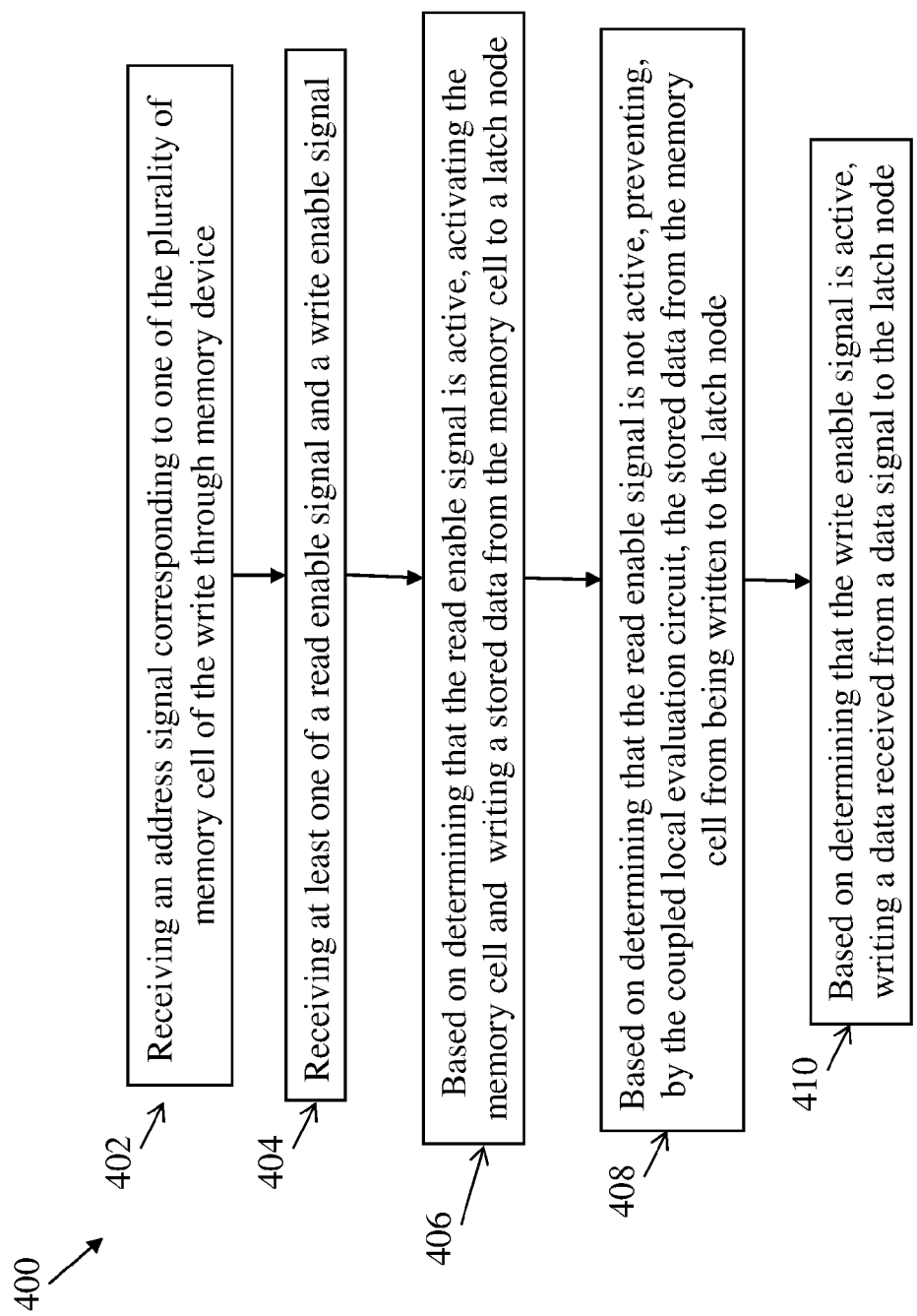
FIG. 4 depicts a flow chart illustrating a method for increasing the frequency of a write through memory device in accordance with an embodiment.

Referring now to FIG. 4, a flowchart illustrating a method 400 for increasing the frequency of a write through memory device is shown. As illustrated at block 402, the method 400 includes receiving an address signal corresponding to one of the plurality of memory cell of the write through memory device. Next, as shown at block 404, the method 400 includes receiving at least one of a read enable signal and a write enable signal. Based on determining that the read enable signal is active, the method 400 includes activating the memory cell and writing a stored data from the memory cell to a latch node, as shown at block 406. Based on determining that the read enable signal is not active, the method 400 includes preventing, by the coupled local evaluation circuit, the stored data from the memory cell from being written to a latch node, as shown at block 408. Based on determining that the write enable signal is active, the method 400 includes writing a data received from a data signal to the latch node, as shown at block 410.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described above with reference to flowchart illustrations and/or schematic diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A high frequency write through memory device comprising:
   a plurality of memory cells;
   a common signal path configured to receive an address signal, the address signal corresponding to the at least one of the plurality of memory cells of the write through memory device, wherein the common signal path includes a plurality of AND gates;
   a read data signal path which includes the common signal path and a first AND gate;
   a read enable signal path which includes the common signal path and a second AND gate; and
   a plurality of local evaluation circuits, wherein each of the plurality of local evaluation circuits is coupled to one of the plurality of memory cells;

wherein each of the plurality of local evaluation circuits is configured to receive an output of the read data signal path and the read enable signal path and to responsively prevent the data stored in the coupled memory cell from being written to a latch node and to output an input data signal to the latch node during the write through operation based on the read enable signal being inactive and to responsively permit the data stored in the coupled memory cell to be written to the latch node during a read operation, which is indicated by the read signal being active and wherein the use of the common signal path by both the read data signal path and the read enable signal path minimizes a timing variation between the two paths.

2. The high frequency write through memory device of claim 1, further comprising:

a write through circuit configured to receive a write enable signal and a data signal and to permit the data signal to be written to the latch node when the write enable signal is active.

3. The high frequency write through memory device of claim 2, wherein a variation between a timing of the data signal being written to the latch node during the write through operation and the stored data being written to the latch node during the read operation is minimized.

* * * * *